United States Patent
Bhavaraju

(10) Patent No.: US 12,144,128 B2
(45) Date of Patent: Nov. 12, 2024

(54) CONVEYOR ROLLER APPARATUS AND METHOD OF USING THE SAME

(71) Applicant: INTELLIGRATED HEADQUARTERS, LLC, Mason, OH (US)

(72) Inventor: Pradeep Jaya Simha Bhavaraju, Andhra Pradesh (IN)

(73) Assignee: INTELLIGRATED HEADQUARTERS, LLC, Mason, OH (US)

( * ) Notice: Subject to any disclaimer, the term of this patent is extended or adjusted under 35 U.S.C. 154(b) by 264 days.

(21) Appl. No.: 17/727,304

(22) Filed: Apr. 22, 2022

(65) Prior Publication Data

US 2023/0345647 A1 Oct. 26, 2023

(51) Int. Cl.
*H05K 5/00* (2006.01)
*B65G 13/06* (2006.01)

(52) U.S. Cl.
CPC ........... *H05K 5/0039* (2013.01); *B65G 13/06* (2013.01)

(58) Field of Classification Search
CPC .............................. H05K 5/0039; B65G 13/06
USPC ........................................................ 198/788
See application file for complete search history.

(56) References Cited

U.S. PATENT DOCUMENTS

| | | | |
|---|---|---|---|
| 6,672,449 B2 | 1/2004 | Nakamura et al. | |
| 10,093,487 B2* | 10/2018 | Ramezani | H02K 1/02 |
| 10,131,502 B2* | 11/2018 | Ramezani | B65G 23/22 |
| 2015/0096800 A1* | 4/2015 | Gerhaeusser | H05K 5/0082 |
| | | | 174/521 |

OTHER PUBLICATIONS

European search report Mailed on Sep. 19, 2023 for EP Application No. 23163864, 9 page(s).

* cited by examiner

*Primary Examiner* — Gene O Crawford
*Assistant Examiner* — Lester III Rushin
(74) *Attorney, Agent, or Firm* — Alston & Bird LLP

(57) ABSTRACT

Various embodiments are directed to a conveyor roller apparatus and methods of using the same. In various embodiments, a conveyor roller apparatus comprises an exterior roller shell configured to support at least a portion of an object disposed on an outer surface thereof to facilitate transportation of the object along a conveyor surface, the exterior roller shell having an at least substantially tubular configuration so as to define an interior roller portion along a central axis thereof; an internal roller housing disposed within the interior roller portion of the exterior roller shell, the internal roller housing comprising a PCB compartment defined by an internal channel within the internal roller housing that is configured for housing the PCB assembly therein; and at least one potting material disposed within the PCB compartment and configured to facilitate a dissipation of heat generated by the PCB assembly from within the PCB compartment.

19 Claims, 4 Drawing Sheets

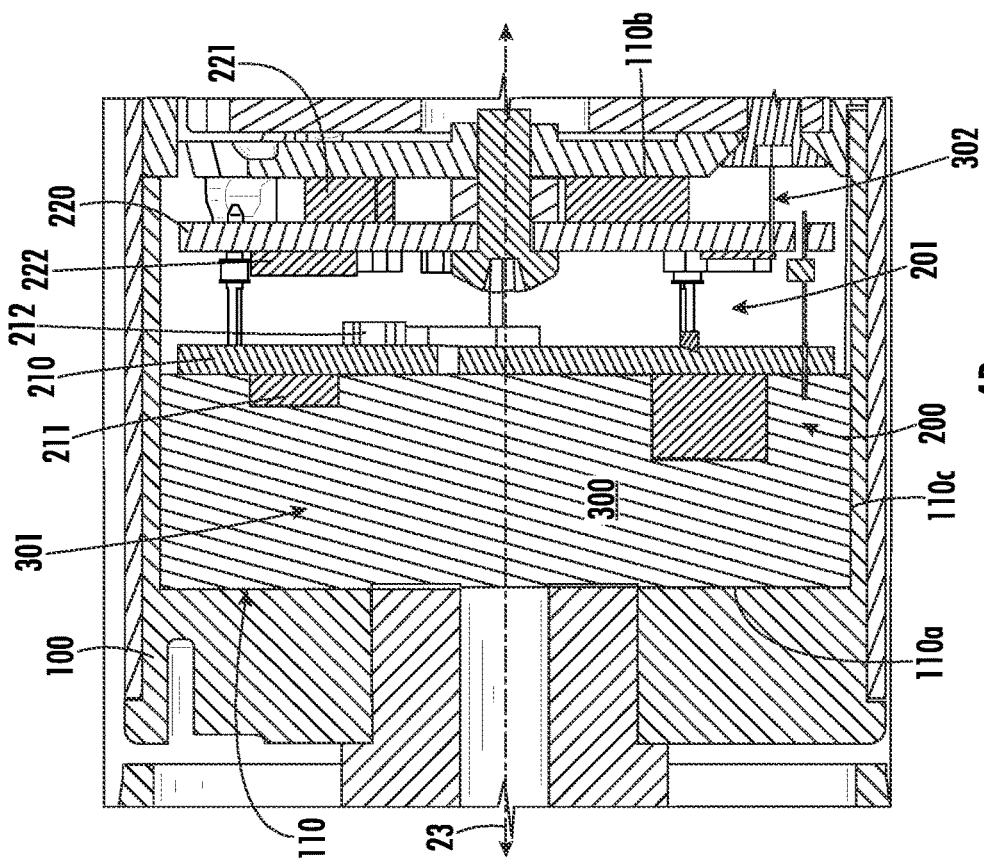
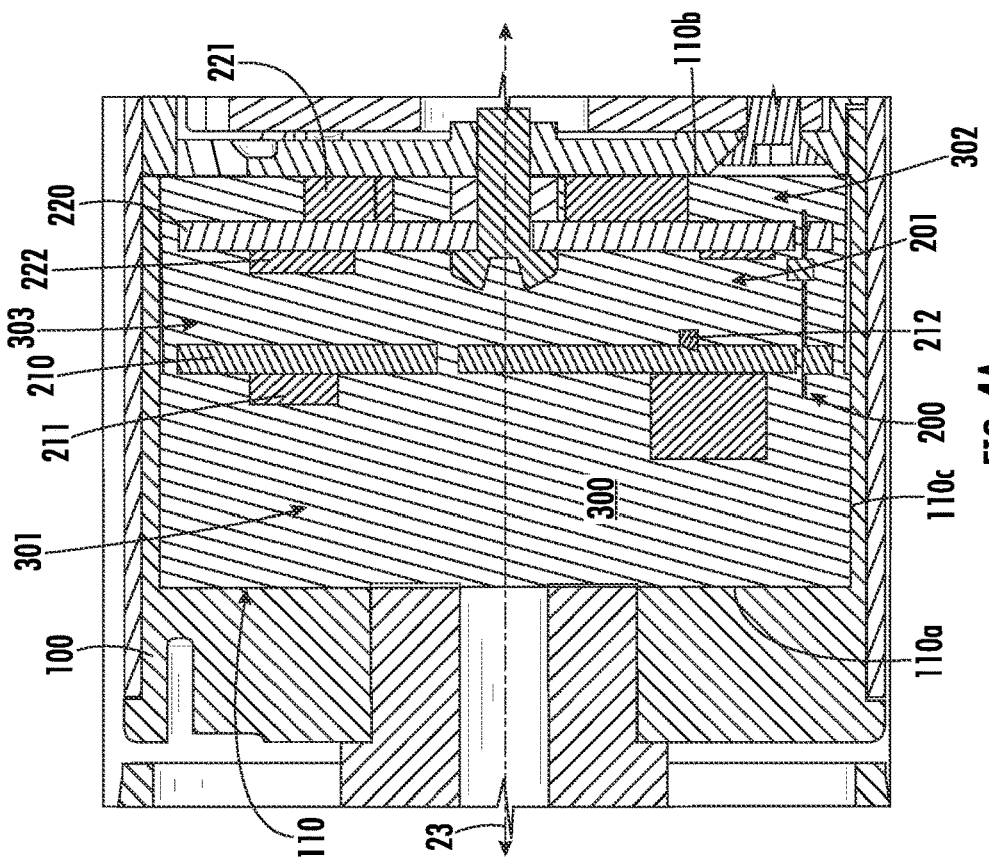

CONVEYOR ROLLER APPARATUS AND METHOD OF USING THE SAME

FIELD OF THE INVENTION

Example embodiments of the present invention relates generally to a material handling system for handling items, and, more particularly, to motorized roller apparatuses for use with conveyor systems.

BACKGROUND

Material handling systems are traditionally used to convey, sort, and organize items (e.g., cartons, cases, etc.) at high speeds. Conventional conveyor systems which are used in material handling systems can include a conveyor bed and multiple conveyor carriers such as conveyor rollers or belts supported on a conveyor frame of the conveyor bed. The multiple conveyor carriers are often used for supporting and transporting items within the material handling system. These materials handling systems often include conveyor assemblies that utilize one or more motorized roller apparatuses to drive transportation of the items along conveyor carriers (e.g., conveyor surfaces) and throughout the material handling system. Through applied effort, ingenuity, and innovation, Applicant has solved problems relating to conveyor roller apparatuses by developing solutions embodied in the present disclosure, which are described in detail below.

BRIEF SUMMARY

Various embodiments are directed to a conveyor roller apparatus and method of using the same. In various embodiments, a conveyor roller apparatus may comprise a conveyor roller apparatus comprising an exterior roller shell configured to support at least a portion of an object disposed on an outer surface thereof to facilitate transportation of the object along a conveyor surface, the exterior roller shell having an at least substantially tubular configuration so as to define an interior roller portion along a central axis thereof; an internal roller housing disposed within the interior roller portion of the exterior roller shell, the internal roller housing comprising a PCB compartment defined by an internal channel within the internal roller housing that is configured for housing the PCB assembly therein; and at least one potting material disposed within the PCB compartment and configured to facilitate an at least partial dissipation of heat generated by the PCB assembly from within the PCB compartment.

In various embodiments, the PCB assembly may comprise at least one PCB in electronic communication with a drive assembly of the conveyor roller apparatus such that the PCB is configured to facilitate operational control of at least a portion of the conveyor roller apparatus. In certain embodiments, the at least one PCB of the PCB assembly may be in electronic communication with a drive motor of the drive assembly such that the PCB is configured to facilitate operational control of the drive motor. In various embodiments, an outer boundary of the PCB component may be defined by a plurality of inner surfaces of the internal roller housing, and wherein the PCB compartment is further defined by a compartment length that extends along a length of the internal roller housing. In certain embodiments, the at least one potting material disposed within the PCB compartment may be configured to occupy at least 50% of an internal compartment volume defined within the PCB compartment. Further, in certain embodiments, the at least one potting material disposed within the PCB compartment comprises a full-potting configuration.

In various embodiments, the PCB assembly may comprise a first PCB and a second PCB arranged within the PCB compartment, wherein at least a portion of the at least one potting material is disposed within a gap defined between the first PCB and the second PCB. In certain embodiments, the first PCB and the second PCB are arranged in an at least substantially parallel configuration relative to one another. In certain embodiments, the at least a portion of the at least one potting material disposed within the gap defined between the first PCB and the second PCB may be physically engaged with a resistor component located on one of the first PCB and the second PCB. In various embodiments, at least a portion of the at least one potting material may be physically engaged with the PCB assembly to facilitate a dissipation of at least a portion of an amount of heat generated by the PCB assembly out of the PCB compartment of the internal roller housing. In certain embodiments, at least a portion of the at least one potting material may be physically engaged with an inner surface of the internal roller housing to facilitate the dissipation of at least a portion of the amount of heat generated by the PCB assembly to the internal roller housing.

In various embodiments, the at least one potting material may be configured to engage an interior surface of the internal roller housing and at least a portion of the PCB assembly so as to secure an arrangement of the at least a portion of the PCB assembly relative to the interior surface. In various embodiments, the at least one potting material may comprise a thermal conductivity of at least substantially greater than 0.025 W/(m*K). In various embodiments, the at least one potting material may comprise a thermal conductivity between 2.0 W/(m*K) and 4.0 W/(m*K).

In various embodiments, the at least one potting material may comprise a thermal interface material. In various embodiments, the at least one potting material may comprise a channel extending therethrough configured to allow for the passage of at least a portion of a wiring assembly engaged with the PCB assembly therethrough. In various embodiments, the at least one potting material may comprise an at least substantially discontinuous material element defined by a plurality of distinct material portions arranged within the PCB compartment. In various embodiments, the internal roller housing may be secured relative to the exterior roller shell such that the internal roller housing is rotated about a central axis thereof during operation of the conveyor roller apparatus; and wherein the at least one potting material is configured to remain engaged with at least a portion of the PCB assembly as the internal roller housing is rotated during operation of the conveyor roller apparatus. In various embodiments, the conveyor roller apparatus may comprise a motorized drive roller.

Various embodiments are directed to a method of operating a conveyor roller apparatus comprising using a PCB assembly in electronic communication with a drive assembly of the conveyor roller apparatus to facilitate operational control of the conveyor roller apparatus, the PCB being disposed within an internal roller housing provided within an interior roller portion of an external roller shell; and causing at least a portion of a heat generated by the PCB assembly during operation of the conveyor roller apparatus to be dissipated from within the internal roller housing using a potting material arranged within the internal roller housing and physically engaged with at least a portion of the PCB assembly.

BRIEF DESCRIPTION OF THE DRAWINGS

Reference will now be made to the accompanying drawings, which are not necessarily drawn to scale. Non-limiting and non-exhaustive embodiments of the subject disclosure are described with reference to the following figures, wherein like reference numerals refer to like parts throughout the various views unless otherwise specified.

FIGS. 4A and 4B illustrate isolated cross-sectional views of an internal roller housing of an exemplary conveyor roller apparatus according to example embodiments described herein.

DETAILED DESCRIPTION

Figure 1:
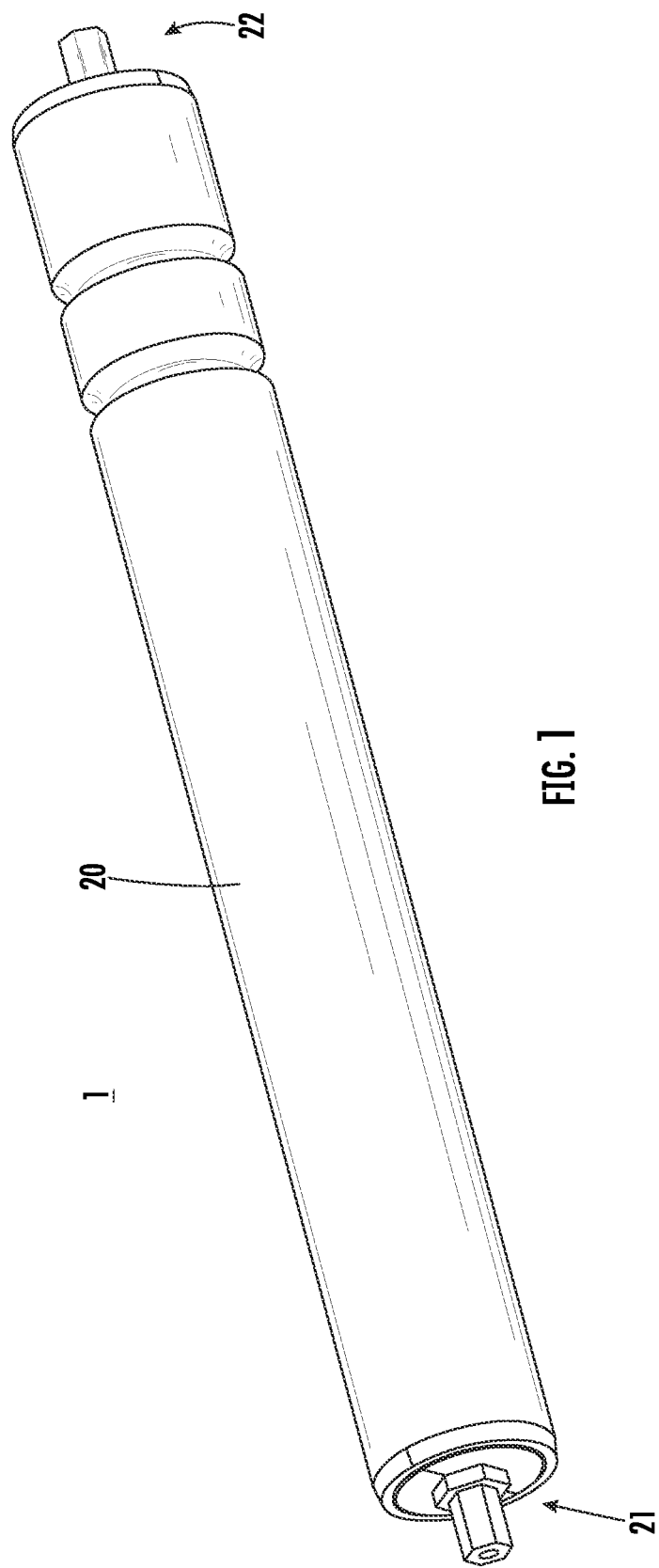
FIG. 1 illustrates a perspective view of an exemplary conveyor roller apparatus according to embodiments described herein.

The present disclosure more fully describes various embodiments with reference to the accompanying drawings. It should be understood that some, but not all embodiments are shown and described herein. Indeed, the embodiments may take many different forms, and accordingly this disclosure should not be construed as limited to the embodiments set forth herein. Rather, these embodiments are provided so that this disclosure will satisfy applicable legal requirements. The terms "or" and "optionally" are used herein in both the alternative and conjunctive sense, unless otherwise indicated. The terms "illustrative" and "exemplary" are used to be examples with no indication of quality level. Like numbers refer to like elements throughout.

It should be understood at the outset that although illustrative implementations of one or more aspects are illustrated below, the disclosed assemblies, systems, and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents. While values for dimensions of various elements are disclosed, the drawings may not be to scale. The components illustrated in the figures represent components that may or may not be present in various embodiments of the invention described herein such that embodiments may include fewer or more components than those shown in the figures while not departing from the scope of the invention.

Turning now to the drawings, the detailed description set forth below in connection with the appended drawings is intended as a description of various configurations and is not intended to represent the only configurations in which the concepts described herein may be practiced. The detailed description includes specific details for the purpose of providing a thorough understanding of various concepts with like numerals denote like components throughout the several views. However, it will be apparent to those skilled in the art that these concepts may be practiced without these specific details.

The words "example," or "exemplary," when used herein, are intended to mean "serving as an example, instance, or illustration." Any implementation described herein as an "example" or "exemplary embodiment" is not necessarily preferred or advantageous over other implementations.

As used herein, the terms "drive roller," "motorized roller", "MDR", "motorized drive roller" and similar terms may be used interchangeably to refer to a master roller which drives multiple slave rollers in accordance with embodiments of the present disclosure. The master roller may be driven by an internal drive or an external drive. Thus, use of any such terms should not be taken to limit the spirit and scope of embodiments of the present disclosure.

Various embodiments disclosed herein provide for an axle lock assembly for roller shafts used in motor-driven rollers (MDRs) used in a conveyor system. For example, a motorized drive roller typically includes an internal drive motor, a cylindrical exterior shell, and various electronic components and/or assemblies configured to facilitate operation of the roller. Various conveyor roller apparatuses may include one or more electronic components that disperse heat upon being used during operation of the conveyor roller apparatus. In various roller apparatus configurations, prolonged operation and/or the use of high-powered printed circuit boards (PCBs) may result in a large amount of heat being dispersed from a PCB assembly disposed within the roller apparatus. As a result of the heat dispersed into the roller apparatus, many conveyor roller apparatuses may experience undesirably high temperatures at various locations within the roller apparatus, which can result in dangerous operating conditions, various operational inefficiencies, and a decreased product lifespan.

Through applied effort, ingenuity, and innovation, many of the above identified problems have been solved by developing solutions that are included in embodiments of the present disclosure, many examples of which are described in detail herein. The present disclosure relates to a conveyor roller apparatus comprising an internal roller housing arranged inside of an exterior roller shell of the conveyor roller apparatus. The internal roller housing comprises a printed circuit board (PCB) compartment embodying a hollow channel defined within the internal roller housing that is configured to receive a PCB assembly therein such that the PCB assembly of the conveyor roller apparatus such that the PCB assembly is arranged within an interior roller portion of the exterior roller shell throughout operation of the conveyor roller apparatus. According to an embodiment, one or more components of the PCB assembly, such as, for example, one or more PCBs and/or an electronic component located on the PCBs, may be in electronic communication with the drive assembly of the exemplary conveyor roller apparatus such that the PCB assembly is configured to control and/or otherwise cause operation of the conveyor roller apparatus based on one or more power signals, command signals, control signals, and/or the like generated by the PCB assembly arranged within the PCB compartment of the internal roller housing.

According to an embodiment, the present invention may include a conveyor roller apparatus comprising a potting material arranged within in the PCB compartment and configured to facilitate an efficient dissipation of heat generated by operation of the PCB assembly from within the PCB compartment. As described herein, the potting material provided within the PCB compartment of the internal roller housing may comprise a heat-conductive media configured to facilitate a transfer of at least a portion of the heat generated by the PCB assembly out of the PCB compartment, such that the internal temperature of the conveyor roller apparatus near the PCB assembly (e.g., within the PCB compartment of the internal roller housing) is maintained at a reasonably reduced temperature throughout operation of the apparatus. The potting material of the present invention may enable one or more high-powered PCB assemblies—defined by a large amount of heat dispersion during operation thereof—to be used in operating the conveyor roller apparatus, as the heat conductivity of the potting material causes a more efficient transfer and/or removal of the PCB-generated heat from within the PCB compartment, thereby avoiding undesirably high operating temperatures within the conveyor roller apparatus. Further, in various embodiments, the potting material provided within the PCB compartment may be physically engaged with at least a portion of the PCB assembly, such as, for example, one or more of the electronic components located on a power PCB or a micro PCB, in order to both facilitate heat dispersion therefrom while also functioning as an additional means of securing the position of one or more electronic components relative to a PCB of the PCB assembly, such that the potting material may prevent inadvertent detachment of the electrical components from the PCB as the PCB assembly is rotated during operation of the present invention.

As described herein, the present invention may at least substantially minimize the instances wherein operation of the conveyor roller apparatus results in a high-temperature condition near the PCB assembly disposed in an interior of the roller apparatus. By at least substantially maximizing the efficiency of heat dispersion from within the PCB compartment of the internal roller housing, the conveyor roller apparatus described herein minimizes the risk of dangerously high-temperature operating conditions, avoids the operational inefficiencies caused by various components of the apparatus overheating during operation, and further prevents the undesirably high-temperature operating conditions that can cause damage to the apparatus and/or reduce the lifespan thereof.

In the following detailed description of exemplary embodiments of the disclosure, specific representative embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from the general scope of the disclosure. The following detailed description is, therefore, not to be taken in a limiting sense, and the scope of the present disclosure is defined by the appended claims and equivalents thereof.

Throughout this specification, the term 'conveyor' or 'conveyor system' may be used interchangeably and term 'conveyor' may be taken as an example of a roller conveyor utilizing one or more drive rollers.

Referring now specifically to the drawings and the illustrative embodiments depicted therein, FIG. 1 illustrates a perspective view of an exemplary conveyor roller apparatus according to embodiments described herein. In particular, FIG. 1 illustrates a perspective view of an exemplary conveyor roller apparatus 1 comprising a drive roller configured for use within a conveyor system. In various embodiments, an exemplary conveyor roller apparatus 1 may be utilized within a conveyor system to facilitate the delivery and/or transportation of one or more objects disposed thereon along a conveyor to a desired location within a materials handling environment. In various embodiments, as illustrated, an exemplary conveyor roller apparatus 1 may comprise a generally cylindrical exterior roller shell 20 that extends along a length of the apparatus 1 between a first lateral end and a second lateral end thereof.

In various embodiments, an exemplary conveyor roller apparatus 1 may comprise an exterior roller shell 20, a first roller end component 21 and a second roller end component 22. In various embodiments, the first roller end component 21 and the second roller end component 22 of the conveyor roller apparatus 1 may be configured to facilitate installation of the conveyor roller apparatus 1 within a conveyor frame of a conveyor system. For example, the first and second roller end components 21, 22 may be at least partially fixed at respective lateral portions of the conveyor assembly (e.g., lateral sidewalls of a conveyor frame) such that the conveyor roller apparatus 1 is restricted from being moved linearly relative to the conveyor frame, while being configured for rotation about a central axis of the conveyor roller apparatus 1. In various embodiments, one or more of the first roller end component 21 and the second roller end component 22 may be at least partially defined by a mechanical component, assembly, and/or the like configured to enable the external roller shell 20 of the conveyor roller apparatus 1 to rotate about the central axis thereof. As a non-limiting example, in various embodiments, the first roller end component 21 may comprise an axle element that is fixedly secured relative to the exterior roller shell 20 such that the axel element provided at the first lateral end of the conveyor roller apparatus 1 is not configured for rotation relative to the exterior roller shell 20. as, for example, a bearing assembly, an axle assembly, and/or the like, or any combination thereof. Further, as an additional non-limiting example, in various embodiments, the second roller end component 22 may comprise a bearing assembly configured to enable the rotation of the conveyor roller apparatus 1 about the central axis thereof. be rotatably engaged with engage enable the rotation of rotatably engaged secured relative to the exterior roller shell 20 such that the axel element provided at the first lateral end of the conveyor roller apparatus 1 is not configured for rotation relative to the exterior roller shell 20. For example, during operation of the exemplary conveyor roller apparatus 1, the exterior roller shell 20 (e.g., the cylindrical outer surface thereof) may be rotated about a central axis of the exterior roller shell 20 that is defined along the length of the conveyor roller apparatus 1 between the first roller end component 21 and the second roller end component 22.

In various embodiments, as described herein, the conveyor roller apparatus may comprise a drive roller, such as, for example, a motorized drive roller. In such an exemplary circumstance, as described herein, the conveyor roller apparatus 1 may comprise a drive assembly including a drive motor configured to enable operation of the conveyor roller apparatus 1 by causing the conveyor roller apparatus 1 to be rotated about its central axis. In various embodiments, for example, an exemplary conveyor roller apparatus 1 may comprise a motorized drive roller (MDR) configured to be operated by a drive motor that selectively causes the conveyor roller apparatus 1 to rotate about a central axis thereof based at least in part on one or more electronic signals transmitted to the drive motor from a PCB assembly (e.g., including a controller, communications circuitry, and/or the like) disposed within an interior roller portion of the conveyor roller apparatus 1, as described herein.

Figure 2:
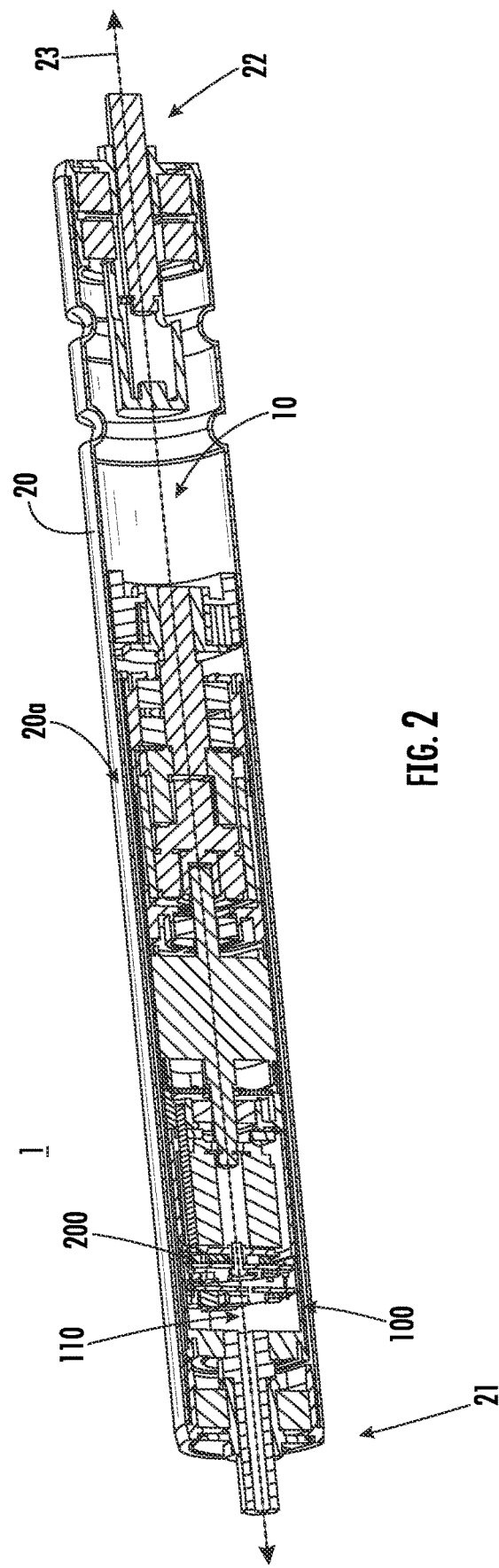
FIG. 2 illustrates a cross-sectional perspective view of an exemplary conveyor roller apparatus according to embodiments described herein.

FIG. 2 illustrates a cross-sectional perspective view of an exemplary conveyor roller apparatus according to embodiments described herein. In particular, FIG. 2 illustrates an exemplary conveyor roller apparatus 1 comprising an exterior roller shell 20 that defines an interior roller portion 10 comprising a hollow internal volume within the exterior roller shell 20 that extends along a central axis 23 thereof between the opposing lateral ends 21, 22 of the conveyor roller apparatus 1. In various embodiments, an exemplary conveyor roller apparatus 1 may comprise an at least substantially tubular configuration, wherein the exterior roller shell 20 comprises a cylindrical configuration that includes an outer surface 20a that defines a conveyor surface of the conveyor roller apparatus 1. Further, in such an exemplary circumstance, the exterior roller shell 20 may define an internal roller portion 10 comprising a hollow internal channel extending along at least a portion of the length of the conveyor roller apparatus 1.

In various embodiments, the internal roller portion 10 defined by the exterior roller shell 20 may be configured to receive an internal roller housing 100 therein. As described herein, an exemplary an internal roller housing 100 provided within the interior roller portion 10 may be configured to house one or more control elements (e.g., a power circuitries, control circuitries, circuit boards, sensor, and/or the like) of the conveyor roller apparatus 1 therein, so as to facilitate the arrangement of the one or more control elements within the interior roller portion 10 of the conveyor roller apparatus 1. In various embodiments, as illustrated, the internal roller housing 100 may comprise an at least substantially cylindrical configuration corresponding, at least in part, to the cylindrical configuration of the interior roller portion 10 defined by the exterior roller shell 20. Further, in various embodiments, the internal roller housing 100 may be configured for installation within the interior roller portion 10 in an at least substantially fixed configuration such that the internal roller housing 100 is at least partially (e.g., linearly) secured relative to the exterior roller shell 20. For example, in various embodiments, as the exterior roller shell 20 is rotated about the central axis 23, the internal roller housing 100 is secured relative to the external roller shell 20 such that the internal roller housing 100 exhibits a corresponding rotation through at least substantially the same range of rotational motion. Alternatively, or additionally, in various embodiments, the internal roller housing 100 may be fixed about the central axis 23 in the rotational direction such that as the exterior roller shell 20 is rotated about the central axis 23, the internal roller housing 100 may maintains its orientation within the interior roller portion 10 of the exterior roller shell 20 so as to define a range of relative rotational motion between the exterior roller shell 20 and the internal roller housing 100. In various embodiments, the internal roller housing 100 may be defined at least in part by an internal roller housing length that extends along the length of the conveyor roller apparatus 1 in an at least substantially parallel direction to the central axis 23.

In various embodiments, an internal roller housing 100 of an exemplary conveyor roller apparatus 1 may comprise a printed circuit board (PCB) compartment 110 within which a PCB assembly 200 of the conveyor roller apparatus 1 may be secured, housed, and/or otherwise positioned. The PCB compartment 110 of an exemplary internal roller housing 100 may be defined by a hollow channel (e.g., a cylindrical opening) that extends along at least a portion of the length of the internal roller housing 100 within the internal roller housing 100, such as, for example along the central axis 23 of the exterior roller shell 20, and is configured for receiving a PCB assembly 200 therein so as to facilitate an arrangement of the PCB assembly 200 within the internal roller housing 100. For example, the PCB compartment 110 may comprise a cylindrical channel having an internal volume defined within the internal component housing 100, within which at least a portion of the PCB assembly 200 may be fixedly installed. As described herein, the PCB compartment 110 of the internal roller housing 100 may house therein a PCB assembly 200 configured to facilitate operational control of at least a portion of the conveyor roller apparatus 1 based on electronic communication with a drive assembly of the conveyor roller apparatus 1. In various embodiments the PCB assembly 200 may be fixedly secured to the internal roller housing 100 at one or more interior surfaces of the internal roller housing 100 that defines an outer boundary of the PCB compartment 110, such that a PCB assembly 200 provided in an installed configuration relative to the internal roller housing 100 may be arranged within the PCB compartment 110.

Figure 3:
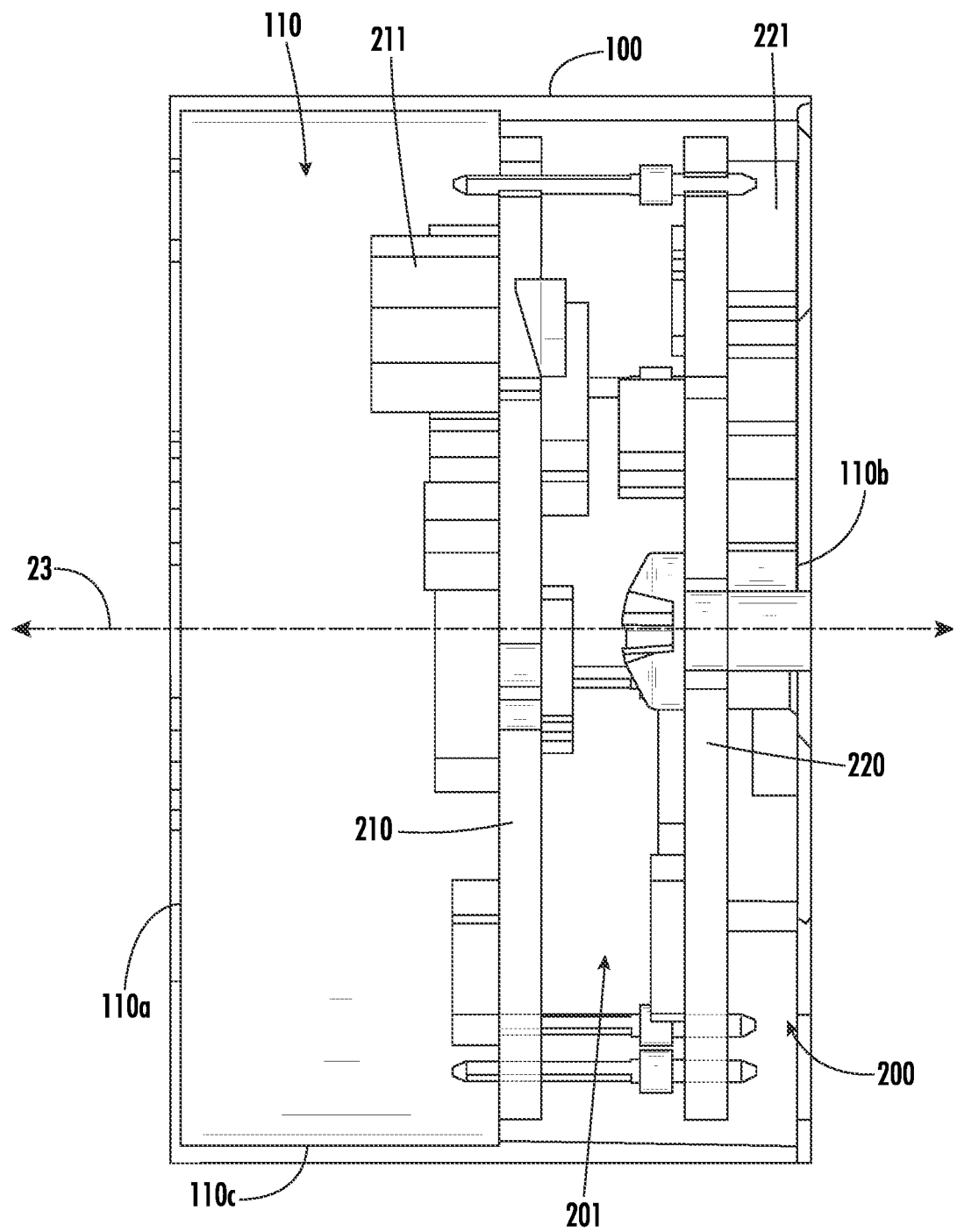
FIG. 3 illustrates an isolated cross-sectional view of an internal roller housing of an exemplary conveyor roller apparatus according to embodiments described herein.

FIG. 3 illustrates an isolated cross-sectional view of an internal roller housing of an exemplary conveyor roller apparatus according to embodiments described herein. In particular, FIG. 3 illustrates a cross-sectional view of a PCB compartment 110 of an exemplary internal roller housing 100 with a PCB assembly 200 being disposed within the PCB compartment 110. In various embodiments, the PCB assembly 200 may be configured to control and/or otherwise cause operation of at least a portion of the conveyor roller apparatus 1 based on one or more power signals, command signals, control signals, and/or the like generated by the PCB assembly 200 and transmitted to at least one apparatus 1 component in electronic communication with the PCB assembly 200 (e.g., a drive assembly). In various embodiments, as illustrated, an exemplary PCB assembly 200 provided within the PCB compartment 110 of an internal roller housing 100 may comprise one or more printed control boards (PCBs) having a plurality of electronic components arranged thereon. As non-limiting examples, a PCB assembly 200 may comprise one or more electronic components arranged on a PCB within the PCB compartment 110, such as, for example, a semiconductor diode (e.g., Schottky diode), a switching regulator, a buck diode, a resistor, a transistor (e.g., MOSFET), a microcontroller, a comparator, a motor driver, a hall sensor, an inductor, an oscillator, a relay, a potentiometer, transformer, and/or the like, or any combination thereof. Further, in various embodiments, the one or more PCBs of the PCB assembly 200 may comprise an at least substantially disc-shaped configuration defined by a thickness defined between opposing lateral faces of the PCB (e.g., as measured in a direction at least substantially parallel to the central axis 23) and a rounded perimeter corresponding at least in part to the at least substantially cylindrical configuration of the PCB compartment 110. As a non-limiting example, in various embodiments, an exemplary PCB assembly 200 may comprise one or more PCBs having a thickness of at least approximately between 0.2 mm and 2.75 mm (e.g., between 1.25 mm and 2.00 mm).

In various embodiments, the PCB assembly 200 may be installed within the PCB compartment 110 by coupling at least one of the one or more PCBs (e.g., a second PCB 220) of the PCB assembly 200 to a surface within the PCB compartment 110, such as, for example, a second inner surface 110b defining a portion of the outer boundary of the PCB compartment 110. In various embodiments, the PCB assembly 200 (e.g., a first PCB 210 comprising a power PCB and/or a second PCB 220 comprising a micro PCB) may be configured for electronic communication with at least a portion of the drive assembly of the conveyor roller apparatus 1, such as, for example, a drive motor, in order to facilitate the control and/or operation of the at least a portion of the drive assembly in communication therewith. For example, the PCB assembly 200 may be configured to generate, transmit, and/or receive various power signals, command signals, control signals via an electronic communication means having a wired configuration and/or a wireless configuration, or a combination thereof. For example, in various embodiments, the PCB assembly 200 may be electronically connected to at least a portion of the drive assembly of the conveyor roller apparatus 1 via one or more wires extending between the PCB assembly 200 (e.g., the one or more PCBs of the assembly) and the corresponding portion of the drive assembly in communication therewith. In such an exemplary circumstance, the PCB compartment 110 may be configured to facilitate the routing of the one or more wires between the PCB assembly 200 disposed within the PCB compartment 110 and another component of the conveyor roller apparatus 100 positioned external to the PCB compartment 110.

For example, in various embodiments, the one or more PCBs of the PCB assembly 200 may comprise a plurality of PCBs, including a first PCB 210 and a second PCB 220. As illustrated in FIG. 3, the first PCB 210 and the second PCB 220 of an exemplary PCB assembly 200 may be arranged within the PCB compartment 110 and positioned relative to one another so as to be separated by a gap 201 defined by a lateral separation distance that extends in a direction at least substantially parallel to the central axis 23. Further, in various embodiments, the first PCB 210 and the second PCB 220 of the PCB assembly 200 may be connected by one or more fastening means (e.g., rods, hooks, bolts, screws, and/or the like) configured to restrict the range of relative motion between the first PCB 210 and the second PCB 220. In various embodiments, the first PCB 210 and the second PCB 220 may be arranged in an at least substantially parallel configuration relative to one another.

As a non-limiting example, in various embodiments, a first PCB 210 of the PCB assembly 200 may comprise a power PCB configured to drive a power signal(s) used to power one or more components of the conveyor roller apparatus 1 in order to facilitate operation thereof. In such an exemplary circumstance wherein the first PCB 210 comprises a power PCB, the PCB assembly 200 may further comprise at least one electronic component attached to the first PCB 210 at one of the opposing lateral faces thereof. As a non-limiting example, in various embodiments, a first PCB 210 comprising a power PCB may comprise a first diode (e.g., a Schottky diode) and a first switching regulator attached to a first lateral face, and a second switching regulator, a second diode (e.g., a buck diode), and a resistor attached to the opposing second lateral face of the first PCB 210. Further, in various embodiments, a second PCB 220 of the PCB assembly 200 may comprise a micro PCB configured for controlling and/or monitoring the operation and/or a corresponding operating condition of the exemplary conveyor roller apparatus 1. In such an exemplary circumstance wherein the second PCB 220 comprises a micro PCB, the PCB assembly 200 may further comprise at least one electronic component attached to the second PCB 220 at one of the opposing lateral faces thereof. As a non-limiting example, in various embodiments, a second PCB 220 comprising a micro PCB may comprise a MOSFET and a motor driver attached to a first lateral face thereof, and a resistor, a microcontroller, and a comparator attached to the opposing second lateral face of the second PCB 220. In various embodiments the second PCB 220 comprising a micro PCB may be fastened by a fastening means (e.g., a screw) to an electromechanical brake assembly. For example, in various embodiments, the electromechanical brake assembly may be in contact with a MOSFET located on the second PCB 220 to facilitate heat transfer.

As described herein, the PCB assembly 200 may be configured such that an operation of the conveyor roller apparatus 1 that is caused, controlled, and/or defined at least in part by one or more signals transmitted from the PCB assembly 200 may cause a resultant amount of heat to be generated and/or emitted by one or more components of the PCB assembly 200. For example, in various embodiments, an operation of an exemplary conveyor roller apparatus may be defined by an actuation of the drive assembly that is controlled, operated, and/or defined, at least in part, by the PCB assembly 200 (e.g., via one or more signals communicated therebetween). In such an exemplary circumstance, at least a portion of the PCB assembly 200, such as, for example, a first PCB 210 comprising a power PCB, a second PCB 220 comprising a micro PCB, one or more electronic components (e.g., a semiconductor diode (e.g., Schottky diode), a switching regulator, a buck diode, a resistor, a transistor (e.g., MOSFET), a microcontroller, a comparator, a motor driver, a hall sensor, and/or the like) located on one of the first and second PCBs 210, 220, and/or the like, may emit, dissipate, and/or otherwise transmit an amount of heat therefrom into the PCB compartment 110.

In various embodiments, an exemplary conveyor roller apparatus 1 may comprise at least one potting material disposed within the PCB compartment 110 of the internal roller housing 100 that is configured to facilitate an at least partial dissipation of heat generated by the PCB assembly 200 from within the PCB compartment 110. FIGS. 4A and 4B illustrate isolated cross-sectional views of an internal roller housing of an exemplary conveyor roller apparatus according to example embodiments described herein. In particular, FIGS. 4A and 4B illustrate an internal roller housing 100 having at least one potting material 300 provided within the PCB compartment 110 such that the space (e.g., the volume) within the PCB compartment 110 is at least partially filled by the at least one potting material 300. As described herein, the at least one potting material 300 provided within the PCB compartment 110 may comprise a heat-conductive media made at least in part of a material having a high thermal conductivity such that the at least one potting material 300 is configured to dissipate at least a portion of the heat generated by the PCB assembly 200. For example, as described herein, upon the conveyor roller assembly 1 being operated such that an amount of heat is generated by the PCB assembly 200 (e.g., a power PCB 210, a micro PCB 220, and/or one of the electronic components located thereon, or any combination thereof) within the PCB compartment 110, the potting material 300 may function as a heat-conductive media configured to facilitate an efficient transfer (e.g., dissipation) of at least a portion of the heat from the PCB assembly 200 to another location outside of the PCB compartment 110 (e.g., outside of the internal roller housing 100). Accordingly, the at least one potting material 300 provided within the PCB compartment 110 may be configured to cause at least a portion of the heat within the PCB compartment 110 and/or at a surface of one or more components of the PCB assembly 200 (e.g., a power PCB 210, a micro PCB 220, and/or one of the electronic components located thereon) to be dissipated such that the temperature within the PCB compartment 110 and/or at the surface of one or more components of the PCB assembly 200 is at least partially reduced in order to avoid undesirably high operating temperatures at the PCB assembly 200 during operation of the conveyor roller apparatus 1.

Such an exemplary conveyor roller apparatus 1 comprising at least one potting material 300, as described herein, enables operation of the conveyor roller apparatus 1 using a high-powered PCB assembly 200, while also causing the temperature(s) within the conveyor roller apparatus 1 (e.g., at various locations within the interior roller portion 10 proximate the PCB assembly 200) to remain within a reasonable range of reduced temperatures within the apparatus 1. For example, operating the conveyor roller apparatus 1 using a high-powered PCB assembly 200 and a potting material 300, as described herein, enables the apparatus 1 to avoid undesirably high operating temperatures within the apparatus 1 (e.g., caused by heat dissipated from the high-powered PCB assembly 200) that are known to cause dangerous operating conditions, decrease in the operational efficiency of the apparatus 1, and further reduce the lifespan thereof. As a non-limiting example, in various embodiments, the at least one potting material 300 may comprise a thermal interface material such as, for example, a thermal paste, thermal adhesive, thermal gap filler, thermally conductive pad, thermal tape, phase changing material, and/or the like, or any combination thereof. Further in various embodiments, the at least one potting material 300 may include a material such as, for example, epoxy, silicone, polyurethane, and/or the like, or any other applicable material characterized by a desirably high-temperature resistance, chemical resistance, thermal conductivity, thermal shock, processability, flexibility, thermal expansion, electrical insulation, and/or adhesion material properties. Further, as a non-limiting example, in various embodiments, the at least one potting material 300 may comprise a material having a thermal conductivity of at least approximately between 0.025 W/(m*K) and 400.0 W/(m*K) (e.g., between 2.0 W/(m*K) and 4.0 W/(m*K)). As a further non-limiting example, in various embodiments, the at least one potting material 300 may comprise a fluid material, such as a gas, a liquid, and/or any combination thereof, configured to facilitate heat dissipation within the conveyor roller apparatus as described herein.

In various embodiments, the at least one potting material 300 may be physically engaged with at least a portion of the PCB assembly 200, such as, for example, one or more lateral faces of a first PCB 210 (e.g., a power PCB), one or more lateral faces of a second PCB 220 (e.g., a micro PCB), and/or one or more electrical components located on one of the PCBs) to facilitate a dissipation of heat generated by the PCB assembly 200 out of the PCB compartment 110 of the internal roller housing 100. Additionally, or alternatively, in various embodiments, the at least one potting material 300 may be physically engaged with an inner surface of the internal roller housing 100 (e.g., a first inner surface 110a, a second inner surface 110b, and/or a third inner surface 110c defining an outer boundary of the PCB compartment 110) to facilitate the dissipation of heat generated by the PCB assembly 200 from within the PCB compartment 110. For example, in various embodiments, the at least one potting material 300 may be physically engaged with both the PCB assembly 200 and an inner surface of the internal roller housing 100 such that the at least one potting material 300 is configured to facilitate a transfer of heat generated by the PCB assembly 200 (e.g., within the PCB component 110) out of the internal roller housing 100. In various embodiments, the at least one potting material 300 may comprise a singular material element (e.g., a mass of material having a high thermal conductivity, a thermal pad having a high thermal conductivity, and/or the like) arranged to fill at least a portion of the volume within the PCB compartment 110. Alternatively, or additionally, in various embodiments, the at least one potting material 300 may comprise an at least substantially discontinuous material element defined by a plurality of distinct material portions arranged at respective locations about the PCB compartment 110.

In various embodiments, for example, as illustrated in FIG. 4A, the at least one potting material 300 of the conveyor roller apparatus 1 may be configured in a full-potting configuration within the PCB compartment 110, wherein at least substantially all of the available space (e.g., unoccupied volume) within the PCB compartment 110 is occupied by the at least one potting material 300. In such an exemplary configuration, the potting material 300 provided in a full-potting configuration may fill at least substantially all of the PCB compartment 110 that is not occupied by a component of the PCB assembly 200, such that the potting material 300 is configured to physically engage each of the first, second, and third inner surfaces, 110a, 110b, 110c, and the PCB assembly, including each of the one or more PCBs arranged within the PCB compartment 110 (e.g., the first PCB 210 and the second PCB 220). Further, the potting material 300 provided in the PCB compartment 110 in a full-potting configuration may be configured to at least substantially surround, encapsulate, envelope, and/or otherwise fully cover the thermally conductive components of the PCB assembly 200 that are disposed within the PCB compartment 110, such as, for example, the power PCB 210, the micro PCB 220, and the electronic components attached thereto. For example, a potting material 300 comprising a full-potting configuration may be defined by an exterior shape that corresponds at least in part to the cylindrical shape of the PCB compartment 110 (e.g., as defined by the inner surfaces 110a, 110b, 110c), with at least substantially all of the PCB assembly 200 being disposed within a thickness of the potting material 300 (e.g., covered in a central portion of the potting material). Further, in various embodiments, the at least one potting material 300 may be defined by one or more fins exposed with an ambient and/or at least partially external environment relative to the PCB compartment 110 in order to facilitate further heat dissipation with respect to the heat generated by the PCB assembly 200.

In various embodiments, the conveyor roller assembly 1 may be configured such that the effectiveness of the at least one potting material 300 with respect to facilitating reduced internal conveyor temperatures may be directly proportional to the amount of potting material 300 (e.g., the mass of potting material 300, the surface area of the potting material 300, and/or the like) provided within the PCB compartment 110. As a non-limiting example, in various embodiments, the mass of the potting material 300 provided in a full-potting configuration within the PCB compartment 110 may be at least approximately between 10 g and 120 g (e.g., between 22 g and 66 g). As a further non-limiting example, in various embodiments, the surface area of the potting material 300 provided in a full-potting configuration within the PCB compartment 110 may be at least approximately between 10000 $mm^2$ and 12000 $mm^2$ (e.g., between 11650 $mm^2$ and 11700 $mm^2$). For example, in various embodiments, the mass of the potting material 300 may be positioned within the PCB compartment 110 such that the center of mass for the conveyor roller apparatus 1 as a whole is brought closer to 23 central axis. Accordingly, the one or more potting materials 300 may be arranged so as to reduce vibration and minimized undesirable ware on the conveyor roller apparatus 1 as the apparatus is rotated about the axis 23 during operation.

In such an exemplary circumstance, as shown, at least a portion of the at least one potting material 300, such as, for example, a third material portion 303, may be provided within the gap 201 defined between the first PCB 210 (e.g., the power PCB) and the second PCB 220 (e.g., the micro PCB). For example, the at least one potting material 300 may be configured to contact at least a portion of the electronic components that are located on either the first PCB 210 or the second PCB 220 and positioned within the gap 201, such that at least a portion of the heat generated by the aforementioned electronic components may be dissipated from the gap 201 by the third material portion 303 of the potting material 300 disposed therein. As a non-limiting example, in various embodiments, at least a portion of the third material portion 303 of the potting material 300 disposed within the gap 201 between the power PCB 210 and the micro PCB 220 may be physically engaged with at least one electronic component 222 located on the micro PCB 220 in a position within the gap 201 comprising one or more of a shunt resistor, a comparator, and a microcontroller such that an amount of heat generated by each of the aforementioned plurality of electronic components during operation of the conveyor roller apparatus 1 may be directly transferred to the third material portion 303 configured to facilitate dispersion thereof from the PCB compartment 110. As a further non-limiting example, in various embodiments, at least a portion of the third material portion 303 disposed within the gap 201 may be physically engaged with at least one electronic component 212 located on the power PCB 210 in a position within the gap 201 comprising one or more of a switching regulator, a diode (e.g., a buck diode), and a resistor such that an amount of heat generated by each of the aforementioned plurality of electronic components during operation of the conveyor roller apparatus 1 may be directly transferred to the third material portion 303 configured to facilitate dispersion thereof from the PCB compartment 110.

Further, in various embodiments, at least a portion of the potting material 300, such as, for example, a first material portion 301, may be provided within a space of the PCB compartment 110 between the first PCB 210 (e.g., the power PCB) and the first inner surface 110a of the internal roller housing 100 defining an outer lateral boundary of the PCB compartment 110. The first material portion 301 may be configured to contact at least a portion of the electronic components located on the first PCB 210, such as, for example, on the lateral surface of first PCB 210 that faces towards the first inner surface 110a, such that at least a portion of the heat generated by the aforementioned electronic components may be dissipated from the PCB compartment 110 by the first material portion 301 of the potting material 300. As a non-limiting example, in various embodiments, at least a portion of the first material portion 301 of the potting material 300 may be physically engaged with at least one electronic component 111 located on the lateral surface of power PCB 210 facing towards the first inner surface 110a comprising a diode (e.g., a Schottky diode) and a switching regulator such that an amount of heat generated by each of the aforementioned plurality of electronic components during operation of the conveyor roller apparatus 1 may be directly transferred to the first material portion 301 configured to facilitate dispersion thereof from the PCB compartment 110.

Further still, in various embodiments, at least a portion of the potting material 300, such as, for example, a second material portion 302, may be provided within a space of the PCB compartment 110 between the second PCB 220 (e.g., the micro PCB) and the second inner surface 110b of the internal roller housing 100 defining an outer lateral boundary of the PCB compartment 110. The second material portion 302 may be configured to contact at least a portion of the electronic components located on the second PCB 220, such as, for example, on the lateral surface of second PCB 220 that faces towards the second inner surface 110b, such that at least a portion of the heat generated by the aforementioned electronic components may be dissipated from the PCB compartment 110 by the second material portion 302 of the potting material 300. As a non-limiting example, in various embodiments, at least a portion of the second material portion 302 of the potting material 300 may be physically engaged with at least one electronic component 221 located on the lateral surface of micro PCB 220 facing towards the second inner surface 110b comprising one or more of a transistor (e.g., MOSFET) and a motor driver such that an amount of heat generated by each of the aforementioned electronic components during operation of the conveyor roller apparatus 1 may be directly transferred to the second material portion 302 configured to facilitate dispersion thereof from the PCB compartment 110.

In various embodiments, the at least one potting material 300 of the conveyor roller apparatus 1 may be arranged within the PCB compartment 110 such that at least substantially less than the entirety of the available space within the PCB compartment 110 is occupied by the potting material 300. For example, as illustrated in FIG. 4B, the at least one potting material 300 of the conveyor roller apparatus 1 may be configured in a half-potting configuration within the PCB compartment 110, wherein only a portion of the available space within the PCB compartment 110, such as, for example, at least approximately half of the open volume, is occupied by the potting material 300. As a non-limiting example, the exemplary potting material 300 illustrated in FIG. 4B is arranged within the PCB compartment 110 in a half-potting configuration, wherein the first material portion 301 provided within the space of the PCB compartment 110 between the first PCB 210 and the first inner surface 110a represents the only potting material 300 present within the PCB compartment 110. In such an exemplary configuration wherein the potting material 300 is provided in a half-potting configuration within the PCB compartment 110, the PCB compartment 110 that is not occupied by the potting material 300 may be filled within air.

Further, in various embodiments, an exemplary conveyor roller apparatus 1 may comprise at least one potting material 300 comprising a channel extending through at least a portion thereof configured to allow for the passage of at least a portion of a wiring assembly engaged with the PCB assembly 200 (e.g., the one or more PCBs 210, 220) therethrough in order to facilitate a wired connection between the PCB assembly 200 and one or more other components of the conveyor roller apparatus 1 positioned external t the PCB compartment 110 and/or the internal roller housing 100. For example, at least a portion of the potting material 300 defined by such an exemplary channel extending therethrough may be configured to facilitate the routing of the one or more wires between the power PCB 210 and/or the micro PCB 220 and a drive motor of the conveyor roller apparatus 1.

Experimental testing was conducted to verify the effectiveness of embodiments as described herein. Data was collected over the course of multiple trials using various combinations of embodiments described above.

An exemplary testing configuration was utilized to capture temperature data in a PCB compartment within which a PCB assembly is located in order to facilitate a comparison of a baseline roller apparatus without potting material in which the PCB compartment of the internal roller housing is filled with air (e.g., without any potting material provided therein) to an exemplary conveyor roller apparatus configured according to various embodiments described herein, wherein a potting material is provided in the PCB compartment of the internal roller housing of the exemplary conveyor roller assembly The exemplary conveyor roller apparatus used in the experimental testing included the potting material in the PCB compartment in a full-potting configuration such that the PCB compartment was filled with the potting material. The potting material used in the exemplary conveyor roller apparatus had a thermal conductivity rating of 3.0 W/(m*K).

The first roller apparatus without potting material (e.g., the baseline roller apparatus) and the second roller apparatus comprising the potting material were tested separately in a first experimental run and a second experimental run, respectively. Both the first and second experimental runs were conducted for a runtime of at least 90 minutes. Further, the first and second roller apparatuses, configured without potting material and with potting material, respectively, were configured with a set of five thermocouples configured to capture temperature data at five distinct locations within the respective conveyor roller apparatus near the PCB assemblies: i) a Schottky diode located on a power PCB, ii) the surface of the power PCB, iii) a shunt resistor located on the micro PCB, iv) a MOSFET-Q2 located on the micro PCB, and v) the surface of the micro PCB. Temperature data was captured at least substantially continuously by each of the respective sets of thermocouples throughout their respective experimental runs.

As part of the experiment, a first run was conducted using the roller apparatus without potting material. The roller apparatus without potting material was operated for a runtime of 90 minutes in a testing environment that was maintained at an ambient temperature of approximately 23° C. throughout the first run. Each of the five thermocouples positioned within the PCB compartment of the roller apparatus without potting material were connected to a data logger device and configured to at least substantially continuously transmit data captured throughout the run to the data logger device, which was configured to at least substantially continuously record corresponding temperature readings associated with each of the five thermocouples throughout the entirety of the 90 minute experimental run. The roller apparatus without potting material was operated at a speed of 197 feet per minute (FPM) and a current of 2.0 A for the first 60 minutes of the first run, with the current being increased to 2.5 A thereafter for the remaining 30 minutes of the first run.

Similarly, a second experimental run was conducted using an exemplary conveyor roller apparatus comprising a potting material in the PCB compartment at which the PCB assembly of the apparatus is installed, in accordance with various embodiments described herein. The experimental conveyor roller apparatus was operated for a runtime of 90 minutes in a testing environment that was maintained at an ambient temperature of approximately 23° C. throughout the second experiment run. Each of the five thermocouples positioned within the PCB compartment of the experimental conveyor roller apparatus were connected to a data logger device and at least substantially continuously transmitted captured data to the data logger device throughout the experimental run. The data logger device was at least substantially continuously recorded corresponding temperature readings associated with the data captured by each of the five thermocouples throughout the entirety of the 90 minute experimental run. The experimental conveyor roller apparatus was operated at a speed of 197 feet per minute (FPM) and a current of 2.0 A for the first 60 minutes of the first run, with the current being increased to 2.5 A thereafter for the remaining 30 minutes of the second experimental run.

Temperature data corresponding to the data collected by each thermocouple at the end of the respective experimental runs (e.g., after 90 minutes) for the roller apparatus without potting material and the experimental conveyor roller apparatus with potting material are shown in Table 1 below:

TABLE 1

| | Temperature (° C.) after 90-Minute Runtime | |
|---|---|---|
| Thermocouple Location | Roller Apparatus without Potting Material in PCB Compartment | Roller Apparatus with Potting Material in Full-Potting Configuration in PCB Compartment |
| Schottky Diode (on Power PCB) | 107.0 | 73.0 |
| Power PCB Surface | 83.0 | 67.0 |
| Shunt Resistor (on Micro PCB) | 92.0 | 75.0 |
| MOSFET-Q2 (on Micro PCB) | 70.0 | 75.0 |
| Micro PCB Surface | 74.5 | 75.0 |

As indicated by the temperature data provided above in Table 1, the exemplary conveyor roller apparatus having the potting material within the PCB compartment to dissipate the heat generated by the PCB assembly maintained a relatively uniform temperature range throughout the five thermocouple locations distributed about the PCB assembly. For example, each of the five temperatures measured within the exemplary conveyor roller apparatus comprising the potting material embodies a reasonably reduced temperature relative to the baseline roller apparatus without the potting material. In various embodiments, as indicated by the data provided above in Table 1, operating an exemplary conveyor roller apparatus having a potting material arranged in a full-potting configuration within a PCB compartment thereof may correspond to a reduction in an internal roller apparatus temperature (e.g., as defined at a location at least substantially near the PCB assembly of the apparatus) of at least approximately 75% relative to a similarly configured apparatus that does not utilize the potting material, as described herein. In contrast to the baseline roller assembly without the potting material, the exemplary conveyor roller apparatus comprising the potting material in a full-potting configuration was operated without the heat dispersed from the PCB assembly causing any undesirably high operating temperatures within the apparatus.

Further, the temperatures measured at the Schottky diode located on the power PCB and the shunt resistor located on the micro PCB were each approximately 30° C. lower in the exemplary conveyor roller apparatus comprising the potting material, as described herein, compared to the roller apparatus tested in the first experimental run without the potting material. Further, the temperature measured at the surface of the power PCB in the exemplary conveyor roller apparatus with the potting material was approximately 10° C. lower than the corresponding temperature of the roller apparatus that did not include utilize the potting material as described herein. In various embodiments, operating the exemplary conveyor roller apparatus with potting material in the PCB compartment in a full-potting configuration resulted in an operating temperature that was 45° C. lower than a corresponding operating temperature measured within the roller apparatus without the potting material in the PCB compartment (e.g., the roller apparatus comprising a PCB compartment at least substantially filled with air) that was measured during the first experimental run.

Many modifications and other embodiments will come to mind to one skilled in the art to which this disclosure pertains having the benefit of the teachings presented in the foregoing descriptions and the associated drawings. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A conveyor roller apparatus comprising:
   an exterior roller shell configured to support at least a portion of an object disposed on an outer surface thereof to facilitate transportation of the object along a conveyor surface, the exterior roller shell having an at least substantially tubular configuration so as to define an interior roller portion along a central axis thereof;
   an internal roller housing disposed within the interior roller portion of the exterior roller shell, the internal roller housing comprising a PCB compartment defined by an internal channel within the internal roller housing that is configured for housing a PCB assembly therein; and
   at least one potting material disposed within the PCB compartment and configured to facilitate an at least partial dissipation of heat generated by the PCB assembly from within the PCB compartment, wherein the at least one potting material is configured to engage an interior surface of the internal roller housing and at least a portion of the PCB assembly so as to secure an arrangement of the at least a portion of the PCB assembly relative to the interior surface.

2. The conveyor roller apparatus of claim 1, wherein the PCB assembly comprises at least one PCB in electronic communication with a drive assembly of the conveyor roller apparatus such that the at least one PCB is configured to facilitate operational control of at least a portion of the conveyor roller apparatus.

3. The conveyor roller apparatus of claim 2, wherein the at least one PCB of the PCB assembly is in electronic communication with a drive motor of the drive assembly such that the PCB assembly is configured to facilitate operational control of the drive motor.

4. The conveyor roller apparatus of claim 1, wherein an outer boundary of the PCB compartment is defined by a plurality of inner surfaces of the internal roller housing, and wherein the PCB compartment is further defined by a compartment length that extends along a length of the internal roller housing.

5. The conveyor roller apparatus of claim 4, wherein the at least one potting material disposed within the PCB compartment is configured to occupy at least 50% of an internal compartment volume defined within the PCB compartment.

6. The conveyor roller apparatus of claim 5, wherein the at least one potting material disposed within the PCB compartment comprises a full-potting configuration.

7. The conveyor roller apparatus of claim 1, wherein the PCB assembly comprises a first PCB and a second PCB arranged within the PCB compartment, wherein at least a portion of the at least one potting material is disposed within a gap defined between the first PCB and the second PCB.

8. The conveyor roller apparatus of claim 7, wherein the first PCB and the second PCB are arranged in an at least substantially parallel configuration relative to one another.

9. The conveyor roller apparatus of claim 7, wherein the at least a portion of the at least one potting material disposed within the gap defined between the first PCB and the second PCB is physically engaged with a resistor component located on one of the first PCB and the second PCB.

10. The conveyor roller apparatus of claim 1, wherein at least a portion of the at least one potting material is physically engaged with the PCB assembly to facilitate a dissipation of at least a portion of an amount of heat generated by the PCB assembly out of the PCB compartment of the internal roller housing.

11. The conveyor roller apparatus of claim 10, wherein at least a portion of the at least one potting material is physically engaged with an inner surface of the internal roller housing to facilitate the dissipation of at least a portion of the amount of heat generated by the PCB assembly to the internal roller housing.

12. The conveyor roller apparatus of claim 1, wherein the at least one potting material comprises a thermal conductivity of at least substantially greater than 0.025 W/(m*K).

13. The conveyor roller apparatus of claim 12, wherein the at least one potting material comprises the thermal conductivity between 2.0 W/(m*K) and 4.0 W/(m*K).

14. The conveyor roller apparatus of claim 1, wherein the at least one potting material comprises a thermal interface material.

15. The conveyor roller apparatus of claim 1, wherein the at least one potting material comprises a channel extending therethrough configured to allow for passage of at least a portion of a wiring assembly engaged with the PCB assembly therethrough.

16. The conveyor roller apparatus of claim 1, wherein the at least one potting material comprises an at least substantially discontinuous material element defined by a plurality of distinct material portions arranged within the PCB compartment.

17. The conveyor roller apparatus of claim 1, wherein the internal roller housing is secured relative to the exterior roller shell such that the internal roller housing is rotated about a central axis thereof during operation of the conveyor roller apparatus; and
   wherein the at least one potting material is configured to remain engaged with the at least a portion of the PCB assembly as the internal roller housing is rotated during operation of the conveyor roller apparatus.

18. The conveyor roller apparatus of claim 1, wherein the conveyor roller apparatus comprises a motorized drive roller.

19. A method of operating a conveyor roller apparatus comprising:
   using a PCB assembly in electronic communication with a drive assembly of the conveyor roller apparatus to facilitate operational control of the conveyor roller apparatus, the PCB assembly being disposed within an internal roller housing provided within an interior roller portion of an external roller shell; and causing at least a portion of a heat generated by the PCB assembly during operation of the conveyor roller apparatus to be dissipated from within the internal roller housing using a potting material arranged within the internal roller housing and physically engaged with at least a portion of the PCB assembly, wherein at least one potting material is configured to engage an interior surface of the internal roller housing and the at least a portion of the PCB assembly so as to secure an arrangement of the at least a portion of the PCB assembly relative to the interior surface.

* * * * *